(12) United States Patent
Ray et al.

(10) Patent No.: US 7,763,413 B2
(45) Date of Patent: Jul. 27, 2010

(54) METHODS FOR IMAGING AND PROCESSING NEGATIVE-WORKING IMAGEABLE ELEMENTS

(75) Inventors: Kevin B. Ray, Fort Collins, CO (US); Ting Tao, Fort Collins, CO (US); Gary R. Miller, Fort Collins, CO (US); Eric E. Clark, Loveland, CO (US); Melanie Roth, Loveland, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/872,772

(22) Filed: Oct. 16, 2007

(65) Prior Publication Data

US 2009/0098482 A1 Apr. 16, 2009

(51) Int. Cl.
 G03C 1/805 (2006.01)
 G03F 7/00 (2006.01)
 G03F 7/26 (2006.01)
(52) U.S. Cl. .................. 430/302; 430/281.1; 430/286.1; 430/300; 101/453; 101/463.1
(58) Field of Classification Search .............. 430/270.1, 430/284, 302
 See application file for complete search history.

(56) References Cited

U.S. PATENT DOCUMENTS

| 4,874,686 | A | 10/1989 | Urabe et al. | |
|---|---|---|---|---|
| 5,035,982 | A | 7/1991 | Walls | |
| 6,569,603 | B2 * | 5/2003 | Furukawa | 430/287.1 |
| 6,596,460 | B2 * | 7/2003 | Timpe et al. | 430/270.1 |
| 6,649,319 | B2 | 11/2003 | Fiebag et al. | |
| 7,041,416 | B2 | 5/2006 | Wakata et al. | |
| 7,153,632 | B1 * | 12/2006 | Saraiya et al. | 430/284.1 |
| 7,279,255 | B2 | 10/2007 | Tao et al. | |
| 2005/0266349 | A1 * | 12/2005 | Van Damme et al. | 430/300 |
| 2006/0199097 | A1 * | 9/2006 | Oda et al. | 430/270.1 |
| 2007/0020563 | A1 | 1/2007 | Inno | |
| 2007/0184380 | A1 * | 8/2007 | Tao et al. | 430/270.1 |

FOREIGN PATENT DOCUMENTS

| EP | 1 182 033 | 11/2006 |
|---|---|---|
| EP | 1 788 429 | 5/2007 |
| EP | 1 788 430 | 5/2007 |
| EP | 1 788 431 | 5/2007 |
| EP | 1 788 434 | 5/2007 |
| EP | 1 788 441 | 5/2007 |
| EP | 1 788 442 | 5/2007 |
| EP | 1 788 443 | 5/2007 |
| EP | 1 788 444 | 5/2007 |
| EP | 1 788 450 | 5/2007 |
| WO | 2005/111727 | 11/2005 |
| WO | 2007/057442 | 5/2007 |

OTHER PUBLICATIONS

U.S. Appl. No. 11/494,235, filed Jul. 27, 2006 titled Negative-Working Radiation-Sensitive Compositions and Imageable Materials, by Ting Tao et al.
U.S. Appl. No. 11/838,935, filed Aug. 15, 2007, titled Negative-Working Imageable Elements and Methods of Use by Geoffrey Horne et al.
U.S. Appl. No. 11/734,796, filed Apr. 13, 2007 titled Negative-Working Imageable Elements and Methods of Use by Jianfei Yu et al.
U.S. Appl. No. 11/441,601, filed May 26, 2006 titled Negative-Working Radiation-Sensitive Compositions and Imageable Materials by Tin Tao et al.

* cited by examiner

*Primary Examiner*—Cynthia H Kelly
*Assistant Examiner*—Chanceity N Robinson
(74) *Attorney, Agent, or Firm*—J. Lanny Tucker

(57) ABSTRACT

An imaged and developed element, such as a lithographic printing plate, is provided by infrared radiation imaging of a negative-working imagable element having an outermost imagable layer that includes a free radically polymerizable component, a free radical initiator composition comprising a diaryliodonium borate, and an infrared radiation absorbing compound. The imagable layer also includes a polymeric binder that is represented by the following Structure (I):

$$-(A)_w-(A')_{w'}- \qquad (I)$$

wherein A represents recurring units comprising a pendant reactive vinyl group, A' represents recurring units other than those represented by A, w is from about 1 to about 70 mol %, and w' is from about 30 to about 99 mol %. The imagewise exposed element is developed with a gum to remove only the non-exposed regions. The gum has a pH greater than 7 and up to about 11 and at least 1 weight % of an anionic surfactant.

9 Claims, No Drawings

METHODS FOR IMAGING AND PROCESSING NEGATIVE-WORKING IMAGEABLE ELEMENTS

FIELD OF THE INVENTION

This invention relates to a method of imaging and processing negative-working imagable elements such as negative-working lithographic printing plate precursors. The invention uses certain gums for processing instead of the usual alkaline developers.

BACKGROUND OF THE INVENTION

Radiation-sensitive compositions are routinely used in the preparation of imagable materials including lithographic printing plate precursors. Such compositions generally include a radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Various radiation-sensitive compositions and imagable elements are described in U.S. Pat. Nos. 6,309,792 (Hauck et al.), 6,893,797 (Munnelly et al.), 6,787,281 (Tao et al.), and 6,899,994 (Huang et al.), U.S. Patent Application Publication 2003/0118939 (West et al.), and EP 1,079,276A1 (Lifka et al.) and EP 1,449,650A1 (Goto). Other negative-working imagable elements are described, for example, in U.S. Pat. Nos. 6,916,595 (Fujimaki et al.), 6,702,437 (Fujimaki et al.), and 6,727,044 (Fujimaki et al.), Japanese Kokai 2000-187322 (Mitsubishi Chemical Co.), and U.S. Patent Application Publications 2004/0131972 (Fujimaki et al.), 2005/0031986 (Kakino et al.), 2006/0068328 (Aimura et al), and 2006/0199097 (Oda et al.).

Such negative-working imagable elements are generally processed after imaging using aqueous high pH developers. Development using gums is described for example, in EP Publications 1,751,625 (Van Damme et al. published as WO 2005/111727) 1,788,429 (Loccufier et al. et al.), 1,788,430 (Williamson et al.), 1,788,431 (Van Damme et al.), 1,788,434 (Van Damme et al.), 1,788,441 (Van Damme), 1,788,442 (Van Damme), 1,788,443 (Van Damme), 1,788,444 (Van Damme), and 1,788,450 (Van Damme), and WO 2007/057442 (Gries et al.). The imagable elements used in these references have either a protective oxygen-barrier overcoat, an intermediate layer between the substrate and imagable layer, or both.

PROBLEM TO BE SOLVED

The various negative-working compositions and elements described in the art can be readily used to prepare negative-working imagable elements. As noted above, these elements are generally developed using high pH aqueous developers, some of which contain organic solvents. There is a desire in the lithographic art, however, to process imaged negative-working imagable elements in a manner that is more environmentally friendly using solutions that are less toxic and corrosive.

SUMMARY OF THE INVENTION

The present invention provides a method of providing an imaged and developed element comprising:

A) using a laser providing infrared radiation, imagewise exposing a negative-working imagable element comprising a substrate having directly thereon an outermost negative-working imagable layer to provide exposed and non-exposed regions, the outermost negative-working imagable layer comprising:

a free radically polymerizable component, an initiator composition capable of generating free radicals sufficient to initiate polymerization of free radically polymerizable groups upon exposure to imaging radiation, the initiator composition comprising a diaryliodonium borate, an infrared radiation absorbing compound, and a primary polymeric binder that is represented by the following Structure (I):

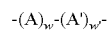

wherein A represents recurring units comprising a pendant reactive vinyl group, A' represents recurring units other than those represented by A, w is from about 1 to about 70 mol %, and w' is from about 30 to about 99 mol %, B) with or without a post-exposure baking step, contacting the imagewise exposed element with a gum to remove only the non-exposed regions to provide an imaged and developed element, the gum having a pH greater than 7 and up to about 11 and comprising at least 1 weight % of one or more anionic surfactants.

The substrate can be an aluminum-containing substrate having a hydrophilic surface upon which the imagable layer is disposed, and the imaged and developed element can be a lithographic printing plate.

Thus, in some embodiments of this invention, imagewise exposure is carried out using imaging infrared radiation having a $\lambda_{max}$ of from about 750 to about 1200 nm, the free radically polymerizable component is an ethylenically unsaturated free-radical polymerizable monomer, oligomer, or crosslinkable polymer.

the initiator composition comprises a diaryliodonium borate that is represented by the following Structure (IB):

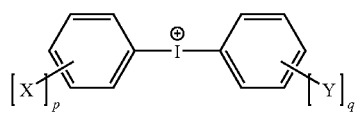

(IB)

wherein X and Y are independently halo, alkyl, alkoxy, aryl, or cycloalkyl groups, or two or more adjacent X or Y groups can be combined to form a fused carbocyclic or heterocyclic ring with the respective phenyl groups, p and q are independently 0 or integers of 1 to 5 as long as either p or q is at least 1 and the sum of the carbon atoms in the X and Y substituents or fused ring(s) is at least 6, and $Z^{\ominus}$ is an organic anion represented by the following Structure ($IB_Z$):

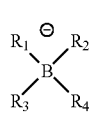

($IB_Z$)

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom, the infrared radiation absorbing compound is an infrared radiation sensitive dye having a tetraaryl pentadiene chromophore, the polymeric binder is represented by the following Structure (IA):

(IA)

wherein said A recurring units are derived from at least allyl (meth)acrylate or styryl (meth)acrylate, said B recurring units are derived from one or more of (meth)acrylonitrile, said C recurring units are derived from one or more of (meth)acrylic acid, 4-carboxyphenyl (meth)acrylate, and 4-carboxystyrene, said D recurring units are derived from one or more of vinyl carbazole, methyl (meth)acrylate, poly(ethylene glycol) methyl ether (meth)acrylate, and a styrene monomer, w is from about 5 to about 50 mol %, x is from about 30 to about 70 mol %, y is from about 5 to about 20 mol %, and z is from 10 to about 40 mol %, the gum is a pre-bake gum having a pH of from about 7.5 to about 10, and comprises an alkyldiphenyloxide disulfonate in an amount of from about 3 to about 30 weight %, and the imaged and developed element is a lithographic printing plate having an aluminum-containing substrate.

With the present invention, imaged negative-working imagable elements can be processed without the use of high pH, toxic, and corrosive developers. Instead, processing can be carried out using certain gums. The processed elements are also advantageous in that they do not require an oxygen barrier overcoat layer or an intermediate layer to adhere the substrate to the outermost imagable layer. Thus, the imagable elements used in this invention are simpler in construction without loss in imaging and developing properties.

DETAILED DESCRIPTION OF THE INVENTION

Definitions

Unless the context indicates otherwise, when used herein, the terms "imagable element", "lithographic printing plate precursor", and "printing plate precursor" are meant to be references to embodiments useful in the present invention.

In addition, unless the context indicates otherwise, the various components described herein such as "primary polymeric binder", "initiator", "co-initiator", "free radically polymerizable component", "infrared radiation absorbing compound", "secondary polymeric binder", and similar terms also refer to mixtures of such components. Thus, the use of the articles "a", "an", and "the" is not necessarily meant to refer to only a single component.

Moreover, unless otherwise indicated, percentages refer to percents by dry weight, for example, weight % based on total solids or dry layer composition.

For clarification of definitions for any terms relating to polymers, reference should be made to "Glossary of Basic Terms in Polymer Science" as published by the International Union of Pure and Applied Chemistry ("IUPAC"), Pure Appl. Chem. 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

Imagable Layers

The imagable elements include an infrared (IR) radiation-sensitive imaging composition disposed on a suitable substrate to form an imagable layer. The imagable elements may have any utility wherever there is a need for an applied coating that is polymerizable using suitable infrared radiation, and particularly where it is desired to remove unexposed regions of the coating instead of exposed regions. The IR radiation-sensitive compositions can be used to prepare an imagable layer in imagable elements such as printed circuit boards for integrated circuits, microoptical devices, color filters, photomasks, and printed forms such as lithographic printing plate precursors that are defined in more detail below.

The IR radiation-sensitive composition (and imagable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated components that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the free radically polymerizable component comprises carboxy groups.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Free radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, N.Y., 1989, pp. 226-262. For example, useful free radically polymerizable components are also described in EP 1,182,033A1 (Fujimaki et al.), beginning with paragraph [0170], and in U.S. Pat. Nos. 6,309,792 (Hauck et al.), 6,569,603 (Furukawa), and 6,893,797 (Munnelly et al.). The free radically polymerizable component can also include carboxy groups as described for example in U.S. Pat. No. 7,153,632 (Saraiya et al.).

The one or more free radically polymerizable components (monomeric, oligomeric, or polymeric) can be present in the imagable layer in an amount of at least 10 weight % and up to 70 weight %, and typically from about 20 to about 50 weight %, based on the total dry weight of the imagable layer. The weight ratio of the free radically polymerizable component to the total polymeric binders (described below) is generally from about 5:95 to about 95:5, and typically from about 10:90 to about 90:10, or even from about 30:70 to about 70:30.

The IR radiation-sensitive composition also includes an initiator composition that is capable of generating free radicals sufficient to initiate polymerization of all the various free radically polymerizable components upon exposure of the composition to imaging radiation. The initiator composition is generally responsive to infrared imaging radiation corresponding to the spectral range of at least 700 nm and up to and including 1400 nm (typically from about 750 to about 1200 nm). Initiator compositions are used that are appropriate for the desired imaging wavelength(s).

Useful initiators compositions include one or more diaryliodonium borates in which the aryl groups of the cation can be substituted or unsubstituted. Possible substituents are described below in relation to Structure (IB). The borate anion has four valences filled with the same or different organic groups, for example, as described below for Structure (IBz).

Useful iodonium cations are well known in the art including but not limited to, U.S. Patent Application Publication 2002/0068241 (Oohashi et al.), WO 2004/101280 (Munnelly et al.), and U.S. Pat. Nos. 5,086,086 (Brown-Wensley et al.), 5,965,319 (Kobayashi), and 6,051,366 (Baumann et al.). For example, a useful iodonium cation includes a positively charged iodonium, (4-methylphenyl)[4-(2-methylpropyl) phenyl]-moiety and a suitable negatively charged borate counterion.

Useful diaryliodonium borates include, but are not limited to, those represented by the following Structure (IB):

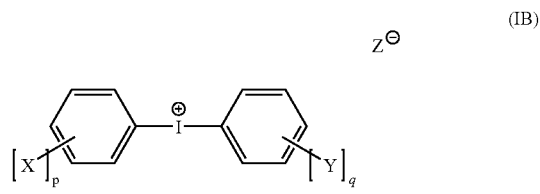

(IB)

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Typically, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated but the "symmetric" compounds (that is, they have the same groups on both phenyl rings) are useful.

In addition, two or more adjacent X or Y groups can be combined to form a fused carbocyclic or heterocyclic ring with the respective phenyl groups.

The X and Y groups can be in any position on the phenyl rings but typically they are at the 2- or 4-positions on either or both phenyl rings.

Despite what type of X and Y groups are present in the iodonium cation, the sum of the carbon atoms in the X and Y substituents generally is at least 6, and typically at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure IB, p and q are independently 0 or integers of 1 to 5, provided that either p or q is at least 1. Typically, both p and q are at least 1, or each of p and q is 1. Thus, it is understood that the carbon atoms in the phenyl rings that are not substituted by X or Y groups have a hydrogen atom at those ring positions.

$Z^{\ominus}$ is an organic anion represented by the following Structure ($IB_Z$):

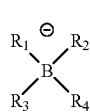

(IB$_z$)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the $R_1$ through $R_4$ groups contains halogen atoms and particularly fluorine atoms.

Typically, $R_1$, $R_2$, $R_3$, and $R_4$ are independently substituted or unsubstituted alkyl or aryl groups as defined above, and more typically, at least 3 of $R_1$, $R_2$, $R_3$, and $R_4$ are the same or different substituted or unsubstituted aryl groups (such as substituted or unsubstituted phenyl groups). For example, all of $R_1$, $R_2$, $R_3$, and $R_4$ can be the same or different substituted or unsubstituted aryl groups, or all of the groups are the same substituted or unsubstituted phenyl group. $Z^{\ominus}$ can be a tetraphenyl borate wherein the phenyl groups are substituted or unsubstituted (for example, all are unsubstituted).

Representative iodonium borate compounds include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis(pentafluorophenyl)borate, 4-methylphenyl-4'-dodecylphenyliodonium tetrakis(4-fluorophenyl)borate, bis(dodecylphenyl)iodonium tetrakis(pentafluorophenyl)-borate, and bis(4-t-butylphenyl)iodonium tetrakis(1-imidazolyl)borate. Mixtures of two or more of these compounds can also be used in the iodonium borate initiator composition.

The diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry*, 37, 4241-4254 (1999).

The free radical generating compounds in the initiator composition are generally present in the imagable layer in an amount of at least 0.5% and up to and including 30%, and typically at least 2 and up to and including about 20%, based on total dry weight of the imagable layer. The optimum amount of the various initiator components may differ for various compounds and the sensitivity of the radiation-sensitive composition that is desired and would be readily apparent to one skilled in the art.

The free radical generating compounds (initiators) may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. Useful mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2,4-triazole.

Other useful co-initiators include metallocenes that are organometallic compounds having one or more cyclopentadienyl ligands that are optionally substituted at one or all of the ring carbons. Each carbon in the five-member ligand ring is coordinated to the transition metal center. Metallocenes are known for having a wide variety of transition metals including iron, titanium, tungsten, molybdenum, nickel, cobalt, chromium, zirconium, and manganese.

For example, ferrocenes have an iron center coordinated by at least one cyclopentadienyl ligand, but ferrocenes also include bicyclopentadienyl "sandwich" compounds. Suitable ferrocene compounds include those that have a hexhapto benzene ligand coordinated to the iron center. Examples of such compounds are described in Col. 7 of U.S. Pat. No. 6,936,384 (Munnelly et al.). Other suitable ferrocenes include compounds having halogenated, aryl-substituted, or haloaryl-substituted cyclopentadienyl ligands.

Titanocenes are also useful in the practice of this invention. Such compounds have a titanium center coordinated by at least one pentahapto cyclopentadienyl ligand and generally include additional ligands that may be known for organometallic complexes. Some suitable titanocene compounds include in their structures aryl ligands, haloaryl ligands, or pyrrole-substituted aryl ligands. Examples of useful titanocenes include those described in Col. 8 of U.S. Pat. No. 6,936,384 (noted above). One commercially available titanocene is (bis)cyclopentadienyl-(bis)2,6-difluoro-3-(pyrr-1-yl)phen-1-yl titanium sold by Ciba Specialty Chemicals as Irgacure® 784, as noted below with the Examples. Other suitable titanocenes are described in U.S. Pat. Nos. 4,548,891 (Riediker et al.), 4,590,287 (Riediker et al.), 5,008,302 (Husler et al.), 5,106,722 (Husler et al.), 6,010,824 (Komano et al.), and 6,153,660 (Fujimaki et al.).

For example, initiator compositions can include the following combinations:

a diaryliodonium borate as described above in combination with a co-initiator that is a metallocene (for example a titanocene or ferrocene) as described for example in U.S. Pat. No. 6,936,384 (noted above), or a diaryliodonium borate as described above in combination with a co-initiator that is a mercaptotriazole as described above.

The radiation-sensitive composition (and imagable element) generally includes one or more infrared radiation absorbing chromophores, or sensitizers, that absorb imaging radiation, or sensitize the composition to imaging infrared radiation having a $\lambda_{max}$ of from about 700 nm and up to and including 1400 nm, and typically from about 700 to about 1200 nm. In some embodiments, the chromophore is cationic in nature.

Useful IR radiation absorbing chromophores include various IR-sensitive dyes ("IR dyes"). Examples of suitable IR dyes comprising the desired chromophore include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. Nos. 5,208,135 (Patel et al.), 6,153,356 (Urano et al.), 6,264,920 (Achilefu et al.), 6,309,792 (Hauck et al.), and 6,787,281 (Tao et al.), and EP 1,182,033A2 (noted above). Infrared radiation absorbing N-alkylsulfate cyanine dyes are described for example in U.S. Pat. No. 7,018,775 (Tao).

A general description of one class of suitable cyanine dyes is shown by the formula in paragraph [0026] of WO 2004/101280 (Munnelly et al.), incorporated herein by reference, and a useful IR absorbing compound is identified below with the Examples.

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (Hauck et al.), 6,264,920 (Achilefu et al.), 6,153,356 (Urano et al.), 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Other useful IR-sensitive dyes having the desired chromophore can be defined by the following Structure DYE-I:

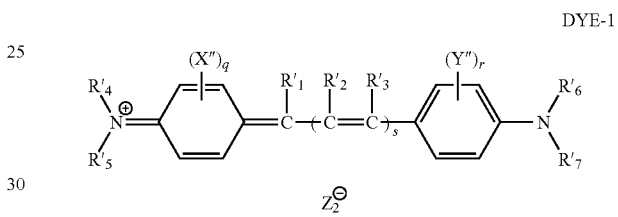

DYE-1 wherein $R_1'$, $R_2'$, and $R_3'$ each independently represents hydrogen, or a halo, cyano, substituted or unsubstituted alkoxy (having 1 to 8 carbon atoms, both linear and branched alkoxy groups), substituted or unsubstituted aryloxy (having 6 to 10 carbon atoms in the carbocyclic ring), substituted or unsubstituted acyloxy (having 2 to 6 carbon atoms), carbamoyl, substituted or unsubstituted acyl, substituted or unsubstituted acylamido, substituted or unsubstituted alkylamino (having at least one carbon atom), substituted or unsubstituted carbocyclic aryl groups (having 6 to 10 carbon atoms in the aromatic ring, such as phenyl and naphthyl groups), substituted or unsubstituted alkyl groups (having 1 to 8 carbon atoms, both linear and branched isomers), substituted or unsubstituted arylamino, or substituted or unsubstituted heteroaryl (having at least 5 carbon and heteroatoms in the ring) group. Alternatively, any two of $R_1'$, $R_2'$, and $R_3'$ groups may be joined together or with an adjacent aromatic ring to complete a 5- to 7-membered substituted or unsubstituted carbocyclic or heterocyclic ring.

For example, $R_1'$, $R_2'$, and $R_3'$ are independently hydrogen, a substituted or unsubstituted carbocyclic aryl group, and a substituted or unsubstituted heteroaryl group.

$R_4'$, $R_5'$, $R_6'$, and $R_7'$ each independently represents hydrogen, a substituted or unsubstituted alkyl group (having 1 to 10 carbon atoms), a substituted or unsubstituted cycloalkyl group (having from 4 to 6 carbon atoms in the ring), a substituted or unsubstituted aryl group (having at least 6 carbon atoms in the ring), or a substituted or unsubstituted heteroaryl group (having 5 to 10 carbon and heteroatoms in the ring).

Alternatively, $R_4'$ and $R_5'$ or $R_6'$ and $R_7'$ can be joined together to form a substituted or unsubstituted 5- to 9-membered heterocyclic ring, or $R_4'$, $R_5'$, $R_6'$, or $R_7'$ can be joined to the carbon atom of the adjacent aromatic ring at a position ortho to the position of attachment of the anilino nitrogen to form, along with the nitrogen to which they are attached, a substituted or unsubstituted 5- or 6-membered heterocyclic ring.

For example, $R_4'$, $R_5'$, $R_6'$, and $R_7'$ are independently a substituted or unsubstituted alkyl group, a substituted or unsubstituted cycloalkyl group, a substituted or unsubstituted aryl group, or $R_4'$ and $R_5'$ or $R_6'$ and $R_7'$ can be joined together to form a substituted or unsubstituted 5- to 7-membered heterocyclic ring. Also, they can be independently substituted or unsubstituted alkyl groups of 1 to 8 carbon atoms, substituted or unsubstituted phenyl groups, or $R_4'$ and $R_5'$ or $R_6'$ and $R_7'$ can be joined together to form a substituted or unsubstituted 5- to 7-membered heteroaryl group.

In the DYE I structure, s is 1, 2, or 3, $Z_2$ is a monovalent anion, X" and Y" are each independently $R_1'$ or the atoms necessary to complete a substituted or unsubstituted 5- to 7-membered fused carbocyclic or heterocyclic ring, and q and r are independently integers from 1 to 4.

For example, X" and Y" are independently hydrogen or the carbon and heteroatoms needed to provide a fused aryl or heteroaryl ring.

Further details of such bis(aminoaryl)pentadiene IR dyes are provided, including representative IR dyes identified as DYE 1 through DYE 17, DYE 19, and DYE 20, in U.S. Pat. No. 6,623,908 (Zheng et al.).

Some useful infrared radiation absorbing dyes have a tetraaryl pentadiene chromophore. Such chromophore generally includes a pentadiene linking group having 5 carbon atoms in the chain, to which are attached two substituted or unsubstituted aryl groups at each end of the linking group. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain.

Such IR-sensitive dyes can be represented by the following Structure DYE-II:

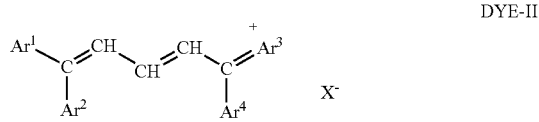

DYE-II wherein $Ar^1$ through $Ar^4$ are the same or different substituted or unsubstituted aryl groups having at least carbon atoms in the aromatic ring (such as phenyl, naphthyl, and anthryl, or other aromatic fused ring systems) wherein 1 to 3 of the aryl groups are substituted with the same or different tertiary amino group (such as in the 4-position of a phenyl group). Typically two of the aryl groups are substituted with the same or different tertiary amino group, and usually at different ends of the polymethine chain (that is, molecule). For example, $Ar^1$ or $Ar^2$ and $Ar^3$ or $Ar^4$ bear the tertiary amine groups. Representative amino groups include but are not limited to those substituted with substituted or unsubstituted alkyl groups having up to 10 carbon atoms or aryl groups such as dialkylamino groups (such as dimethylamino and diethylamino), diarylamino groups (such as diphenylamino), alkylarylamino groups (such as N-methylanilino), and heterocyclic groups such as pyrrolidino, morpholino, and piperidino groups. The tertiary amino group can form part of a fused ring such that one or more of $Ar^1$ through $Ar^4$ can represent a julolidine group.

Besides the noted tertiary groups noted above, the aryl groups can be substituted with one or more substituted or unsubstituted alkyl groups having 1 to 10 carbon atoms, halo atoms (such as chloro or bromo), hydroxyl groups, thioether groups, and substituted or unsubstituted alkoxy groups having 1 to 10 carbon atoms. Substituents that contribute electron density to the conjugated system are useful. While they are not specifically shown in Structure (DYE-II), substituents or fused rings may also exist on (or as part of) the conjugated chain connecting the aryl groups.

In Structure (DYE-II), $X^-$ is a suitable counterion that may be derived from a strong acid, and include such anions as $ClO_4^-$, $BF_4^-$, $CF_3SO_3^-$, $PF_6^-$, $AsF_6^-$, $SbF_6^-$, and perfluoroethylcyclohexylsulfonate. Other cations include boron-containing anions as described above (borates), methylbenzenesulfonic acid, benzenesulfonic acid, methanesulfonic acid, p-hydroxybenzenesulfonic acid, p-chlorobenzenesulfonic acid, and halides.

Two representative IR dyes defined by Structure (DYE-II) are defined as D1 and D2 in WO 98/07574 (Patel et al.). Still other useful IR-sensitive dyes are represented by the following Structure (DYE-III):

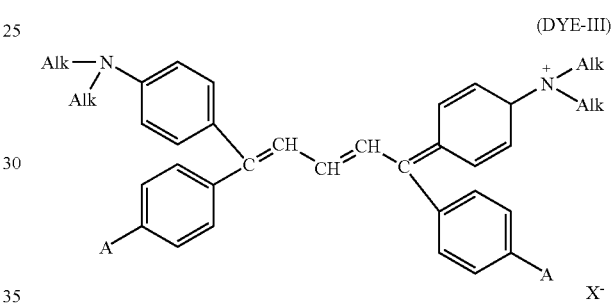

(DYE-III)

wherein "Alk" represents the same or different substituted or unsubstituted alkyl groups having 1 to 7 carbon atoms (such as substituted or unsubstituted methyl, ethyl, iso-propyl, t-butyl, n-hexyl, and benzyl), and "A" represents hydrogen or the same or different substituted or unsubstituted lower alkyl group having 1 to 3 carbon atoms (such as methyl, ethyl, n-propyl, and iso-propyl), or the same or different dialkylamino groups similar to those defined above for Structure (DYE-2), wherein such groups have the same or different alkyl groups. $X^-$ is a suitable counterion as defined above for Structure (DYE-II).

Some embodiments of this invention include a borate anion, such as a tetra-substituted borate anion, which substituents can be the same or different alkyl (having 1 to 20 carbon atoms) or aryl groups (phenyl or naphthyl groups), which groups can be further substituted if desired. Particularly useful boron-containing counterions of this type include alkyltriarylborates, dialkyldiarylborates, and tetraarylborates. Examples of these boron-containing counterions are described for example, in EP 438,123A2 (Murofushi et al.).

Representative useful dyes of this type are described as Dyes 2, 3-A, 3-B, 3-C, 12, and 22 described in EP 438,123A2 (noted above)

Useful infrared radiation absorbing dyes can be obtained from a number of commercial sources including Showa Denko (Japan) or they can be prepared using known starting materials and procedures.

Still other useful infrared radiation absorbing compounds are copolymers can comprise covalently attached ammonium, sulfonium, phosphonium, or iodonium cations and infrared radiation absorbing cyanine anions that have two or four sulfonate or sulfate groups, or infrared radiation absorbing oxonol anions, as described for example in U.S. Pat. No. 7,049,046 (Tao et al.).

The infrared radiation absorbing chromophore (or sensitizer) can be present in the radiation-sensitive composition (or imagable layer) in an amount generally of at least 1% and up to and including 30% and typically at least 3 and up to and including 20%, based on total solids in the composition, that also corresponds to the total dry weight of the imagable layer. The particular amount needed for this purpose would be readily apparent to one skilled in the art, depending upon the specific compound used to provide the desired chromophore.

The imagable layer includes one or more primary polymeric binders that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group ("X") that is not particularly limited. The reactive vinyl groups may be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.). Other useful polymeric binders have vinyl groups in pendant groups that are described, for example in EP 1,182,033A1 (Fujimaki et al.) and U.S. Pat. Nos. 4,874,686 (Urabe et al.) and 7,041,416 (Wakata et al.) that are incorporated by reference, especially with respect to the general formulae (1) through (3) noted in EP 1,182,033A1.

For example, the reactive vinyl group can be represented by the structure: —X—CR$^1$=C(R$^2$)R$^3$ wherein X, R$^1$, R$^2$, and R$^3$ are defined below.

Useful primary polymeric binders can be represented by the following Structure (I):

wherein A represents recurring units comprising one or more pendant reactive vinyl groups that are directly or indirectly attached to the hydrophobic polymeric backbone, A' represents recurring units other than those represented by A, w is from about 1 to about 70 mol %, and w' is from about 30 to about 99 mol %. Thus, the A' recurring units contain no pendant reactive vinyl groups.

For example, the reactive vinyl groups can be connected to the polymer backbone with a carbon-carbon direct bond or a linking group. For example, useful reactive vinyl groups are shown in Structure IIa and IIb below as Z' groups. The X linking groups may be an oxy (—O—), thio (—S—), carbonyloxy [—C(O)O—], carbonamido [—C(O)NR'—], carbonyl [—C(O)—], amido (—NR'—), sulfonyl [—S(=O)$_2$O—], substituted or unsubstituted arylene group (such as a substituted or unsubstituted phenylene group), or a substituted or unsubstituted alkylene group (having 1 to 10 carbon atoms, such as a methylene group), or combinations of two or more of these groups. In particular, X may be an oxy, thio, —NR'—, or substituted or unsubstituted arylene group having 6 to 10 carbon atoms in the ring (such as substituted or unsubstituted phenylene). R' can be hydrogen, a substituted or unsubstituted alkyl group having 1 to 6 carbon atoms, or a substituted or unsubstituted aryl group having 6 or 10 carbon atoms in the ring. In many embodiments, X is a direct bond or a carbonyloxymetheylene or a methyleneoxyphenylene group.

Z' is represented by the following Structure (IIa) or (IIb):

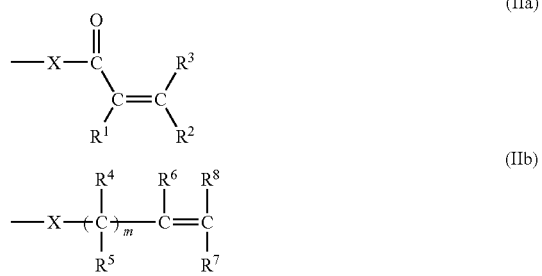

wherein X is defined as above.

R$^1$ to R$^8$ independently represent monovalent organic groups of which there are hundreds of possibilities including but not limited to, hydrogen, substituted or unsubstituted alkyl groups having 1 to 10 carbon atoms, substituted or unsubstituted cycloalkyl groups having 5 to 10 carbon atoms in the unsaturated ring, substituted or unsubstituted aryl groups having 6 to 10 carbon atoms in the aromatic ring, substituted or unsubstituted heterocyclyl groups having 5 to 10 carbon, nitrogen, sulfur, or oxygen atoms in the aromatic or non-aromatic rings, cyano, halo, and vinyl groups.

When the pendant groups comprise the moiety represented by Structure IIb, R$^4$ and R$^5$ can be independently hydrogen or a substituted or unsubstituted alkyl group having 1 to 3 carbon atoms, and R$^6$ to R$^8$ can be independently hydrogen, or a halo group, substituted or unsubstituted alkyl group having 1 to 6 carbon atoms, or a substituted or unsubstituted phenyl group. For example, R$^6$ to R$^8$ can be independently hydrogen or a cloro, methyl, ethyl, or phenyl groups.

In Structure IIb, m is 0 or 1, and preferably it is 1.

For example, Z' can be represented by the following Structure IIc:

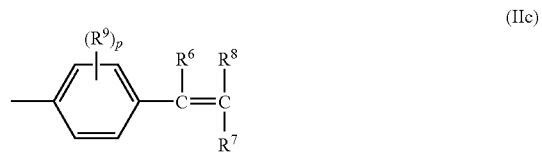

wherein R$^6$ through R$^8$ are as defined above, R$^9$ is a substitutable group or atom that would be readily apparent to one skilled in the art, and p is an integer of 0 to 4. Most preferably, p is 0, and R$^6$ through R$^8$ are all hydrogens.

Some useful pendant reactive vinyl groups are alkenyl groups including but not limited to allyl esters, styryl, and (meth)acryloyl groups. For example, such groups can be provided by allyl (meth)acrylates, or by reacting a polymer precursor with an allyl halide, 4-vinylbenzyl chloride, or (meth)acryloyl chloride using conditions that would be apparent to a skilled worker in the art.

The A' recurring units can be derived from one or more of the polymerizable ethylenically unsaturated monomers that are described below for the B, C, and D recurring units. Generally, recurring units from at least one monomer from each of the B, C, and D groups are present in the desired molar amounts described below.

In some embodiments, the primary polymeric binder can be represented by the following Structure (IA):

-(A)$_w$-(B)$_x$-(C)$_y$-(D)$_z$- (IA)

wherein A represents recurring units comprising a pendant allyl (meth)acrylate group that is directly or indirectly attached to the hydrophobic polymer backbone, B represents recurring units comprising pendant cyano groups, C represents recurring units comprising pendant acidic groups, D represents recurring units other than those represented by A, B, and C, w is from about 1 to about 70 mol %, x is from about 10 to about 80 mol %, y is from about 1 to about 30 mol %, and z is from 0 to about 90 mol %, In other embodiments, w is from about 5 to about 50 mol %, x is from about 30 to about 70 mol %, y is from about 5 to about 20 mol %, and z is from 0 to about 60 mol % (or z can be from about 10 to about 40 mol %).

The B recurring units are generally derived from one or more of (meth)acrylonitrile, cyanostyrenes, or cyano(meth) acrylates. The (meth)acrylonitriles are particularly useful.

The C recurring units comprise one or more acidic groups such as carboxy, phosphoric acid, and sulfonic acid, as well as salts thereof (carboxylates, sulfonates, etc.). Monomers from such recurring units can be derived include but are not limited to, carboxy-containing vinyl monomers, carboxylated styrenes, and sulfated styrenes. Ethylenically unsaturated polymerizable monomers that have carboxy groups, or that have reactive groups that can be converted to carboxy groups, or to which carboxy groups can be attached after polymerization, are particularly useful. Thus, the carboxy groups can be obtained from a number of synthetic methods. Useful monomers having pendant carboxylic acid groups include but are not limited to, (meth)acrylic acid, 4-carboxyphenyl (meth) acrylate, and 4-carboxystyrene.

The D recurring units are derived from one or more of vinyl carbazole or vinyl carbazole derivatives as described in U.S. Pat. No. 7,175,949 (Tao et al.), alkyl (meth)acrylates [such as methyl (meth)acrylates], (meth)acrylamides, N-phenyl maleimides, poly(alkylene glycol) methyl ether (meth)acrylates [such as poly(ethylene glycol) methyl ether (meth)acrylates], and styrene monomers such as substituted and unsubstituted styrene. Useful combinations of D recurring units include a combination of recurring units derived from two or more of a methyl (meth)acrylate, an N-vinyl carbazole, and a polyethylene glycol methyl ether (meth)acrylate. These are merely provided as examples and not intended to be limiting since a skilled artisan could use many other ethylenically unsaturated polymerizable monomers.

In some embodiments, the A recurring units are derived from at least an allyl(meth)acrylate, the B recurring units are derived from one or more of (meth)acrylonitrile, the C recurring units are derived from one or more of (meth)acrylic acid, 4-carboxyphenyl (meth)acrylate, and 4-carboxystyrene, the D recurring units are derived from one or more of vinyl carbazole, methyl (meth)acrylate, poly(ethylene glycol) methyl ether (meth)acrylate, and a styrene monomer.

The primary polymeric binder is generally present in the radiation-sensitive composition in an amount of from about 10 to about 70%, based on the total imagable layer dry weight. These binders may comprise up to 100% of the dry weight of all polymeric binders (primary polymeric binders plus any secondary polymeric binders).

Additional polymeric binders ("secondary" polymeric binders) may also be used in the imagable layer in addition to the primary polymeric binders. Such polymeric binders can be any of those known in the art for use in negative-working radiation-sensitive compositions other than those mentioned above. The secondary polymeric binder(s) may be present in an amount of from about 1.5 to about 70 weight % and typically from about 1.5 to about 40%, based on the dry coated weight of the imagable layer, and it may comprise from about 30 to about 60 weight % of the dry weight of all polymeric binders.

The secondary polymeric binders may be homogenous, that is, dissolved in the coating solvent, or may exist as discrete particles. Such secondary polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182, 033 (Fujimaki et al.) and U.S. Pat. Nos. 6,309,792 (Hauck et al.), 6,352,812 (Shimazu et al.), 6,569,603 (Furukawa et al.), and 6,893,797 (Munnelly et al.). Also useful are the vinyl carbazole polymers described in copending and commonly assigned U.S. Ser. No. 11/356,518 (filed Feb. 17, 2006 by Tao et al.) that is incorporated herein by reference. Copolymers of polyethylene glycol methacrylate/acrylonitrile/styrene in particulate form, dissolved copolymers derived from carboxyphenyl methacrylamide/acrylonitrile/methacrylamide/N-phenyl maleimide, copolymers derived from polyethylene glycol methacrylate/acrylonitrile/vinylcarbazole/-styrene/ methylacrylic acid, copolymers derived from N-phenyl maleimide/methacrylamide/methacrylic acid, copolymers derived from urethane-acrylic intermediate A (the reaction product of p-toluene sulfonyl isocyanate and hydroxylethyl methacrylate)/acrylonitrile/N-phenyl maleimide, and copolymers derived from N-methoxymethyl methacrylamide/methacrylic acid/acrylonitrile/n-phenylmaleimide are useful.

Other useful secondary polymeric binders are particulate poly(urethane-acrylic) hybrids that are distributed (usually uniformly) throughout the imagable layer. Each of these hybrids has a molecular weight of from about 50,000 to about 500,000 and the particles have an average particle size of from about 10 to about 10,000 nm (typically from about 30 to about 500 nm and or from about 30 to about 150 nm). These hybrids can be either "aromatic" or "aliphatic" in nature depending upon the specific reactants used in their manufacture. Blends of particles of two or more poly(urethane-acrylic) hybrids can also be used. For example, a blend of Hybridur® 570 polymer dispersion with Hybridur® 870 polymer dispersion could be used.

Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly (urethane-acrylic) hybrid particles. These dispersions generally include at least 30% solids of the poly(urethane-acrylic) hybrid particles in a suitable aqueous medium that may also include commercial surfactants, anti-foaming agents, dispersing agents, anti-corrosive agents, and optionally pigments and water-miscible organic solvents. Further details about each commercial Hybridur® polymer dispersion can be obtained by visiting the Air Products and Chemicals, Inc. website.

The imagable layer can further comprise one or more phosphate (meth)acrylates, each of which has a molecular weight generally greater than 200 and typically at least 300 and up to and including 1000. By "phosphate (meth)acrylate" we also mean to include "phosphate methacrylates" and other derivatives having substituents on the vinyl group in the acrylate moiety.

Each phosphate moiety is typically connected to an acrylate moiety by an aliphatic chain [that is, an -(aliphatic-O)— chain] such as an alkyleneoxy chain [that is an -(alkylene-O)$_m$— chain] composed of at least one alkyleneoxy unit, in which the alkylene moiety has 2 to 6 carbon atoms and can be either linear or branched and m is 1 to 10. For example, the alkyleneoxy chain can comprise ethyleneoxy units, and m is from 2 to 8 or m is from 3 to 6. The alkyleneoxy chains in a specific compound can be the same or different in length and have the same or different alkylene group.

Useful phosphate (meth)acrylates can be represented by the following Structure (III):

$$P(=O)(OM)_n(OR)_{3-n} \quad (III)$$

wherein n is 1 or 2, M is hydrogen or a monovalent cation (such as an alkali metal ion, ammonium cations including cations that include one to four hydrogen atoms). For example, useful M cations include but are not limited to sodium, potassium, —NH$_4$, —NH(CH$_2$CH$_2$OH)$_3$, and —NH$_3$(CH$_2$CH$_2$OH). When n is 2, the M groups are the same or different. The compounds wherein M is hydrogen are particularly useful.

The R groups are independently the same or different groups represented by the following Structure (IV):

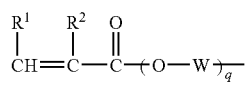

(IV)

wherein R$^1$ and R$^2$ are independently hydrogen, or a halo (such as chloro or bromo) or substituted or unsubstituted alkyl group having 1 to 6 carbon atoms (such as methyl, chloromethyl, methoxymethyl, ethyl, isopropyl, and t-butyl groups). In many embodiments, one or both of R$^1$ and R$^2$ are hydrogen or methyl, and in some embodiments, R$^1$ is hydrogen and R$^2$ is methyl).

W is an aliphatic group having at least 2 carbon or oxygen atoms, or combination of carbon and oxygen atoms, in the chain, and q is 1 to 10. Thus, W can include one or more alkylene groups having 1 to 8 carbon atoms that are interrupted with one or more oxygen atoms (oxy groups), carbonyl, oxycarbonyl, or carbonyl oxy groups. For example, one such aliphatic group is an alkylenecarbonyloxyalkylene group. Useful alkylene groups included in the aliphatic groups have 2 to 5 carbon atoms and can be branched or linear in form.

The R groups can also independently be the same or different groups represented by the following Structure (V):

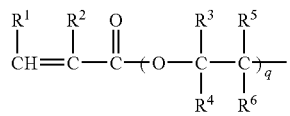

(V)

wherein R$^1$, R$^2$, and q are as defined above and R$^3$ through R$^6$ are independently hydrogen or a substituted or unsubstituted alkyl group having 1 to 6 carbon atoms (such as methyl, methoxymethyl), ethyl, chloromethyl, hydroxymethyl, ethyl, iso-propyl, n-butyl, t-butyl, and n-pentyl groups). Typically, R$^3$ through R$^6$ are independently hydrogen or methyl, and in most embodiments, all are hydrogen.

In Structures IV and V, q is 1 to 10, or from 2 to 8, for example from 3 to 6.

Representative phosphate (meth)acrylates useful in this invention include but are not limited to, ethylene glycol methacrylate phosphate (available from Aldrich Chemical Co.), a phosphate of 2-hydroxyethyl methacrylate that is available as Kayamer PM-2 from Nippon Kayaku (Japan) that is shown below, a phosphate of a di(caprolactone modified 2-hydroxyethyl methacrylate) that is available as Kayamer PM-21 (Nippon Kayaku, Japan) that is also shown below, and a polyethylene glycol methacrylate phosphate with 4-5 ethoxy groups that is available as Phosmer PE from Uni-Chemical Co., Ltd. (Japan) that is also shown below. Still other useful compounds of this type are commercially available from Sartomer Company, Inc. (Exton, Pa.) as Sartomer SR 705, SR 9011, SR 9012, CD 9050, CD 9051, and CD 9053. Other useful nonionic phosphate acrylates are also shown below.

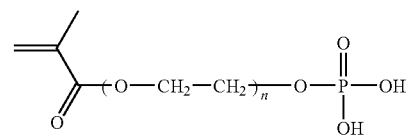

Phosmer PE (n = 4 or 5)

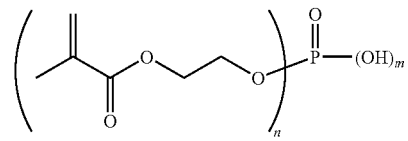

Kayamer PM-2 (m = 1 or 2, n = 3 - m)

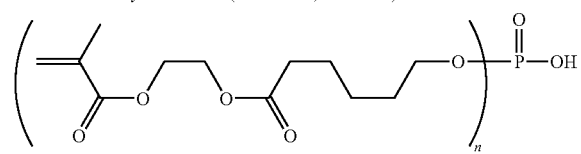

Kayamer PM-21 (n = 2)

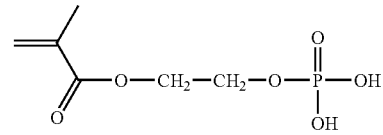

Phosmer M

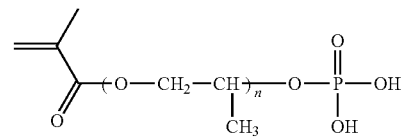

Phosmer PP (n = 5 or 6)

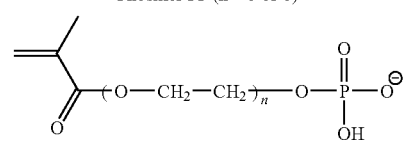

HOCH$_2$CH$_2$NH$_3^+$

Phosmer PEH (n is 4 or 5)

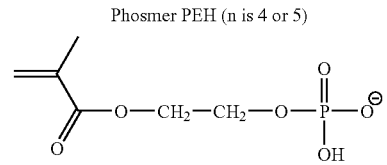

HOCH$_2$CH$_2$NH$_3^+$

Phosmer MH

-continued

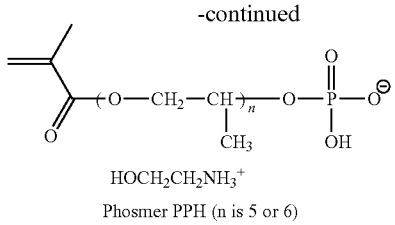

HOCH$_2$CH$_2$NH$_3^+$

Phosmer PPH (n is 5 or 6)

The phosphate acrylate can be present in the imagable layer in an amount of at least 0.5 and up to and including 20% and typically at least 0.9 and up to and including 10%, by weight of the total solids.

The imagable layer can further comprise one or more trialkoxysilylalkyl (meth)acrylates or vinyl trialkoxysilanes, each of which has a molecular weight generally greater than 120 and typically at least 145 and up to and including 1,000. Representative examples of such compounds are the following compounds:

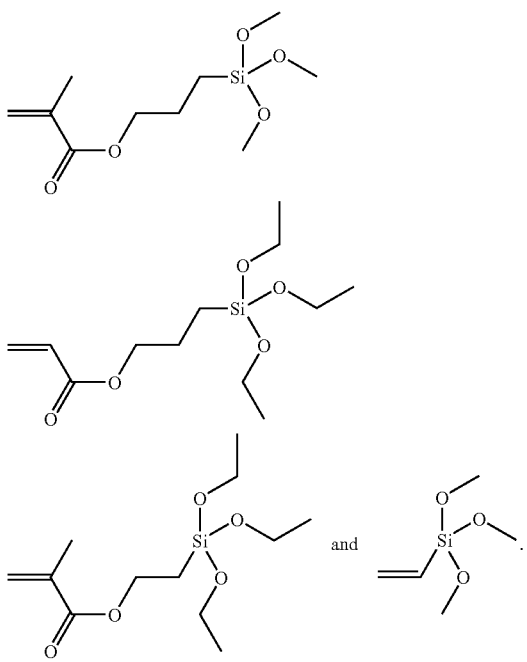

The imagable layer can also include a "primary additive" that is a poly(alkylene glycol) or an ether or ester thereof that has a molecular weight of at least 200 and up to and including 4000. This primary additive is present in an amount of at least 2 and up to and including 50 weight %, based on the total dry weight of the imagable layer. Useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which that can be obtained from Sartomer Company, Inc. In some embodiments, the primary additive may be "non-reactive" meaning that it does not contain polymerizable vinyl groups.

The imagable layer can also include a "secondary additive" that is a poly(vinyl alcohol), a poly(vinyl pyrrolidone), poly(vinyl imidazole), or polyester in an amount of up to and including 20 weight % based on the total dry weight of the imagable layer.

The imagable layer can also include a variety of optional compounds including but not limited to, dispersing agents, humectants, biocides, plasticizers, surfactants for coatability or other properties, viscosity builders, dyes or colorants to allow visualization of the written image (such as crystal violet, methyl violet, ethyl violet, Victoria blue, malachite green, and brilliant green), pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

Imagable Elements

The imagable elements can be formed by suitable application of an infrared radiation-sensitive composition as described above to a suitable substrate to form an imagable layer. This substrate can be treated or coated in various ways as described below prior to application of the radiation-sensitive composition to improve hydrophilicity. Typically, there is only a single imagable layer comprising the radiation-sensitive composition that is directly applied to the substrate without any intermediate layer such as those described in EP Patent Publications described above in the Background of the Invention. If the substrate has been treated to provide improved adhesion or hydrophilicity, the applied imagable layer is disposed thereon but these treatments are not considered "intermediate layers" for the purpose of this invention.

The element does not include what is conventionally known as an overcoat (also known as an "oxygen impermeable topcoat" or "oxygen barrier layer") disposed over the imagable layer, for example, as described in EP Patent Publications 1,788,429, 1,788,431 and 1,788,434 (all noted above) and US Patent Application Publication 2005/0266349 (noted above). Such overcoat layers predominantly comprise one or more poly(vinyl alcohol)s as the predominant polymeric binders. Thus, the imagable layer is the outermost layer of the element.

The substrate generally has a hydrophilic surface, or at least a surface that is more hydrophilic than the applied imagable layer on the imaging side. The substrate comprises a support that can be composed of any material that is conventionally used to prepare imagable elements such as lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfinic acid anodization of the aluminum support generally provides an oxide weight (coverage) on the surface of from about 1.5 to about 5 $g/m^2$ and more typically from about 3 to about 4.3 $g/m^2$. Phosphoric acid anodization generally provides an oxide weight on the surface of from about 1.5 to about 5 $g/m^2$ and more typically from about 1 to about 3 $g/m^2$. When surface acid is used for anodization, higher oxide weight (at least 3 $g/m^2$) may provide longer press life.

The aluminum support may also be treated with, for example, a silicate, dextrine, calcium zirconium fluoride, hexafluorosilicic acid, poly(vinyl phosphonic acid) (PVPA), vinyl phosphonic acid copolymer, poly[(meth)acrylic acid], or acrylic acid copolymer to increase hydrophilicity. Still further, the aluminum support may be treated with a phosphate solution that may further contain an inorganic fluoride (PF). The aluminum support can be electrochemically-grained, sulfuric acid-anodized, and treated with PVPA or PF using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate may be coated with antistatic agents and/or slipping layers or a matte layer to improve handling and "feel" of the imagable element.

The substrate can also be a cylindrical surface having the imagable layer thereon, and thus be an integral part of the printing press. The use of such imaging cylinders is described for example in U.S. Pat. No. 5,713,287 (Gelbart).

An infrared radiation-sensitive composition containing the components described above can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder).

Illustrative of such manufacturing methods is mixing the free radically polymerizable component, primary polymeric binder, initiator composition, IR radiation absorbing compound, and any other components of the infrared radiation-sensitive composition in a suitable coating solvent including water, organic solvents [such as glycol ethers including 1-methoxypropan-2-ol, methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], or mixtures thereof, applying the resulting solution to a substrate, and removing the solvent(s) by evaporation under suitable drying conditions. Some representative coating solvents and imagable layer formulations are described in the Examples below. After proper drying, the coating weight of the imagable layer is generally at least 0.1 and up to and including 5 $g/m^2$ or at least 0.5 and up to and including 3.5 $g/m^2$. Any particulate primary polymeric binders present in the imagable layer may partially coalesce or be deformed during the drying operation.

Once the imagable layer has been applied and dried on the substrate, the imagable element can be enclosed in water-impermeable material that substantially inhibits the transfer of moisture to and from the imagable element.

By "enclosed", we mean that the imagable element is wrapped, encased, enveloped, or contained in a manner such that both upper and lower surfaces and all edges are within the water-impermeable sheet material. Thus, none of the imagable element is exposed to the environment once it is enclosed.

Useful water-impermeable sheet materials include but are not limited to, plastic films, metal foils, and waterproof papers that are usually in sheet-form and sufficiently flexible to conform closely to the shape of the imagable element (or stack thereof as noted below) including an irregularities in the surfaces. Typically, the water-impermeable sheet material is in close contact with the imagable element (or stack thereof). In addition, this material can be sufficiently tight or is sealed, or both, so as to provide a sufficient barrier to the movement or transfer of moisture to or from the imagable element. Useful water-impermeable materials include plastic films such as films composed of low density polyethylene, polypropylene, and poly(ethylene terephthalate), metallic foils such as foils of aluminum, and waterproof papers such as papers coated with polymeric resins or laminated with metal foils (such as paper backed aluminum foil). In addition, the edges of the water-impermeable sheet materials can be folded over the edges of the imagable elements and sealed with suitable sealing means such as sealing tape and adhesives.

The transfer of moisture from and to the imagable element is "substantially inhibited", meaning that over a 24-hour period, the imagable element neither loses nor gains no more than 0.01 g of water per $m^2$. The imagable element (or stack) can be enclosed or wrapped while under vacuum to remove most of the air and moisture. In addition to or instead of vacuum, the environment (for example, humidity) of the imagable element can be controlled (for example to a relative humidity of less than 20%), and a desiccant can be associated with the imagable element (or stack).

For example, the imagable element can be enclosed with the water-impermeable sheet material as part of a stack of imagable elements, which stack contains at least 5 imagable elements and more generally at least 100 or at least 500 imagable elements that are enclosed together. It may be desirable to use "dummy", "reject", or non-photosensitive elements at the top and bottom of the stack to improve the wrapping. Alternatively, the imagable element can be enclosed in the form of a coil that can be cut into individual elements at a later time. Generally, such a coil has at least 1000 $m^2$ of imagable surface, and commonly at least 3000 $m^2$ of imagable surface.

Adjacent imagable elements in the stacks or adjacent spirals of the coil may be separated by interleaving material, for example interleaving paper or tissue ("interleaf paper") that may be sized or coated with waxes or resin (such as polyethylene) or inorganic particles. Many useful interleaving materials are commercially available. They generally have a moisture content of less than 8% or typically less than 6%.

Imaging Conditions

During use, the imagable element is exposed to a suitable source of imaging or exposing radiation such as near-infrared or infrared radiation, depending upon the infrared radiation absorbing compound present in the radiation-sensitive composition, at a wavelength of from about 700 to about 1500 nm. For example, imaging can be carried out using imaging or exposing radiation, such as from an infrared laser at a wavelength of at least 750 nm and up to and including about 1400 nm and typically at least 700 nm and up to and including 1200 nm. Imaging can be carried out using imaging radiation at multiple wavelengths at the same time if desired.

The laser used to expose the imagable element is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imagable member mounted to the interior or exterior cylindrical surface of the drum. An example of an useful imaging apparatus is available as models of Creo Trendsetter® platesetters available from Eastman Kodak Company (Burnaby, British Columbia, Canada) that contain laser diodes that emit near infrared radiation at a wavelength of about 830 mm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm$^2$ and up to and including 500 mJ/cm$^2$, and typically at least 50 and up to and including 300 mJ/cm$^2$ depending upon the sensitivity of the imagable layer.

Development and Printing

With or without a post-exposure baking step after imaging and before development, the imaged elements can be developed "off-press" using a gum (or gum solution) as described herein. A gum solution is typically an aqueous liquid that comprises one or more surface protective compounds capable of protecting the lithographic image of the printing plate against contamination (for example, oxidation, fingerprints, dust or scratches). There are generally two types of "gum" solutions known in the art: (1) a "bake", "baking", or "prebake" gum usually contains one or more compounds that do not evaporate at the usual pre-bake temperatures used for making lithographic printing plates, typically an anionic or nonionic surfactant, and (2) a "finisher" gum that usually contains one or more hydrophilic polymers (both synthetic and naturally-occurring, such as gum Arabic cellulosic compounds, (meth)acrylic acid polymers, and polysaccharides) that are useful for providing a protective overcoat on a printing plate. The gums used in the practice of this invention would be generally considered "pre-bake" gums, and thus, usually lack the hydrophilic polymers.

By using this gum for development, the conventional aqueous alkaline developer compositions containing silicates or metasilicates and a pH of at least 8 and up to and including 14, are avoided.

The gum may be provided in diluted or concentrated form. The amounts of components described below refer to amount in the diluted gum that is likely its form for use in the practice of the invention. However, it is to be understood that the present invention includes the use of concentrated gums and the amounts of various components (such as the anionic surfactants) would be correspondingly increased.

The gum used in this invention is an aqueous solution that generally has a pH greater than 7 and up to about 11, and typically from about 7.5 to about 11, or from about 7.5 to about 10, as adjusted using a suitable amount of a base. The viscosity of the gum can be adjusted to a value of from about 1.7 to about 5 cP by adding a suitable amount of a viscosity increasing compound such as a poly(vinyl alcohol) or poly (ethylene oxide).

In addition, these gums have one or more anionic surfactants as the only essential component, even though optional components (described below) can be present if desired.

Useful anionic surfactants include those with carboxylic acid, sulfonic acid, or phosphonic acid groups (or salts thereof). Anionic surfactants having sulfonic acid (or salts thereof) groups are particularly useful. For example, anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphate alkylester, salts of alkylsulfuric esters, sulfuric esters of polyoxyethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrenemaleic anhydride copolymers, partially saponified compounds of olefin-maleic anhdyride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary or "first" anionic surfactant. Several commercial examples are described in the Examples below. Such surfactants can be obtained from various suppliers as described in McCutcheon's Emulsifiers & Detergents, 2007 Edition.

Particular examples of such surfactants include but are not limited to, sodium dodecylphenoxyoxybenzene disulfonate, the sodium salt of alkylated naphthalenesulfonate, disodium methylene-dinaphthalene disulfonate, sodium dodecylbenzenesulfonate, sulfonated alkyl-diphenyloxide, ammonium or potassium perfluoroalkylsulfonate and sodium dioctylsulfosuccinate.

The one or more anionic surfactants are generally present in an amount of at least 1 weight %, and typically from about 1 to about 45 weight %, or from about 3 to about 30 weight % (based on the weight of the gum).

Two or more anionic surfactants ("first", "second", etc.) can be used in combination. In such mixtures, a first anionic surfactant, such as an alkyldiphenyloxide disulfonate, can be present generally in an amount of at least 1 weight % and typically from about 3 to about 30 weight %. A second surfactant can be present (same or different from the first anionic surfactant) in a total amount of at least 0.1 weight %, and typically from about 2 to about 30 weight %. Second or additional anionic surfactants can be selected from the substituted aromatic alkali alkyl sulfonates and aliphatic alkali sulfates. One particular combination of anionic surfactants includes one or more alkyldiphenyloxide disulfonates and one or more aromatic alkali alkyl sulfonates (such as an alkali alkyl naphthalene sulfonate).

The gums useful in this invention may include nonionic surfactants as described in [0029] or hydrophilic polymers described in [0024] of EP 1,751,625 (noted above), incorporated herein by reference. Particularly useful nonionic surfactants include Mazol® PG031-K (a triglycerol monooleate, Tween® 80 (a sorbitan derivative), Pluronic® L62LF (a block copolymer of propylene oxide and ethylene oxide), and Zonyl® FSN (a fluorocarbon), and a nonionic surfactant for successfully coating the gum onto the printing plate surface, such as a nonionic polyglygol. These nonionic surfactants can be present in an amount of up to 10 weight %, but at usually less than 2 weight %.

Other optional components of the gum include inorganic salts (such as those described in [0032] of U.S. Patent Application 2005/0266349, noted above), wetting agents (such as a glycol), a metal chelating agents, antiseptic agents, anti-foaming agents, ink receptivity agents (such as those described in [0038] of US '349), and viscosity increasing agents as noted above. The amounts of such components are known in the art. Calcium ion chelating agents are particularly useful, including but not limited to, polyaminopolycarboxylic acids, aminopolycarboxylic acids, or salts thereof, [such as salts of ethylenediaminetetraacetic acid (EDTA, sodium salt)], organic phosphonic acids and salts thereof, and phosphonoalkanetricarboxylic acids and salts thereof. Organic amines may also be useful A chelating agent may be present in the gum in an amount of from about 0.001 to about 1 weight %.

Generally, the gum is applied to the imaged element by rubbing, spraying, jetting, dipping, coating, or wiping the outer layer with the gum or a roller, impregnated pad, or applicator containing the gum. For example, the imaged element can be brushed with the gum, or the gum may be poured on or applied by spraying the outer layer with sufficient force to remove the exposed regions using a spray nozzle system as described for example in [0124] of EP 1,788,431A2 (noted above). Still again, the imaged element can be immersed in the gum and rubbed by hand or with an apparatus.

The gum can also be applied in a gumming unit (or gumming station) that has at least one roller for rubbing or brushing the printing plate while the gum is applied during development. By using such a gumming unit, the non-exposed regions of the imaged layer may be removed from the substrate more completely and quickly. The gum used in development can be collected in a tank and the gum can be used several times, and replenished if necessary from a reservoir of gum. The gum replenisher can be of the same concentration as that used in development, or be provided in concentrated form and diluted with water at an appropriate time.

Following off-press development, a postbake operation can be carried out, with or without a blanket or floodwise exposure to UV or visible radiation. Alternatively, a blanket UV or visible radiation exposure can be carried out, without a postbake operation.

Printing can be carried out by applying a lithographic printing ink and fountain solution to the printing surface of the imaged and developed element. The fountain solution is taken up by the non-imaged regions, that is, the surface of the hydrophilic substrate revealed by the imaging and development steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

The following examples are provided to illustrate the practice of the invention but are by no means intended to limit the invention in any manner.

EXAMPLES

Unless otherwise noted below, the chemical components used in the Examples can be obtained from one or more commercial courses such as Aldrich Chemical Company (Milwaukee, Wis.).

The components and materials used in the examples and analytical methods used in evaluation were as follows:

Byk® 307 is a polyethoxylated dimethyl polysiloxane copolymer that is available from Byk Chemie (Wallingford, Conn.) in a 25 wt. % xylene/methoxypropyl acetate solution.

D11 dye is ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl-4-hydroxy-2-methoxybenzenesulfonic acid (1:1) as supplied by PCAS (Longjumeau, France).

DPHA is a dipentaerythritol hexaacrylate obtained from Kowa American (New York, N.Y.).

Dowfax® 2A1 is an alkyldiphenyloxide disulfonate that is available from Dow Chemical Company (Midland, Mich.).

Dowfax® 3B2 is also an alkyldiphenyloxide disulfonate that is available from Dow Chemical Company (Midland, Mich.).

EDTA(Na)$_4$ salt is ethylenediamine tetraacetic acid, tetra sodium salt hydrate (83.6%).

Graft polymer A is a polymer dispersion containing 20 wt % styrene, 70 wt % acrylonitrile, and 10 wt % polyethylene glycol methyl ether methacrylate, 24% in propanol/water (80/20).

Gum 1 (pH ~9.4) is a solution containing 980 g of MX 1591 and 20 g of EDTA(Na)$_4$ salt.

Gum 2 (pH ~8.7) is a solution containing 985 g of MX 1591 and 15 g of EDTA(Na)$_4$ salt.

Gum 3 (pH ~9.9) is a solution containing 960 g of MX 1591 and 40 g of EDTA(Na)$_4$ salt.

Gum 4 (pH ~9.6) is a solution containing 720.4 g of water, 270 g of sodium xylene sulfonate (40% in water) and 9.6 g of EDTA(Na)$_4$ salt.

Gum 5 (pH ~9.6) is a solution containing 720.4 g of water, 270 g of sodium p-toluene sulfonate (40% in water) and 9.6 g of EDTA(Na)$_4$ salt.

Gum 6 (pH=7.8) was prepared as follows: To 700 g of DI water, 77.3 ml of Dowfax® 3B2 anionic surfactant, 32.6 g of trisodium citrate dehydrate, and 9.8 g of citric acid were added under stirring, and the DI water was further added to bring the total weight of 1,000 g. Trisodium phosphate (25 g) was added to adjust the pH to 7.8.

Gum 7 (pH=7) was prepared as follows: To 700 g of DI water, 77.3 ml of Dowfax® 3B2 anionic surfactant, 32.6 g of trisodium citrate dehydrate, and 9.8 g of citric acid were added under stirring, and the DI water was further added to bring the total weight of 1,000 g. Trisodium phosphate (20 g) was added to adjust the pH to 7.0.

Gum 8 (pH=9.8) was prepared by mixing Dowfax® 2A1 anionic surfactant (25 g) and Naxan® ABL anionic surfactant (20 g) in water (55 g).

IR Dye 1 was obtained from Showa Denko (Japan) and is represented by the following structure:

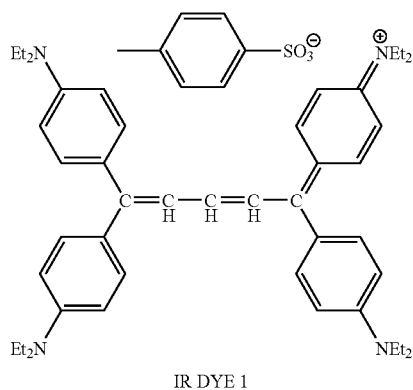

IR DYE 1

IR dye 2 has the following structure:

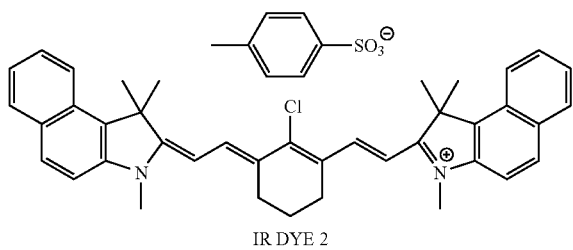

IR DYE 2

Initiator A is bis(4-t-butylphenyl) iodonium tetraphenylborate.

MEK represents methyl ethyl ketone.

Monomer A is the reaction product from 0.1 mol of hexamethylenediisocyanate with 0.2 mol of hydroxymethyl methacrylate in 6 g of MEK.

MX 1591: a pre-bake gum (H=4.2) from Eastman Kodak Company (Rochester, N.Y.).

Naxan ABL is a solution of an alkyl naphthalene sulfonate, sodium salt that is available from Nease Corporation (Cincinnati, Ohio).

PGME represents 1-methoxy-2-propanol and it is also known as Dowanol PM.

Pigment A is a 27% solids dispersion of 7.7 parts of a polyvinyl acetal derived from polyvinyl alcohol) acetalized with acetaldehyde, butyraldehyde, and 4-formylbenzoic acid, 76.9 parts of Irgalith Blue GLVO (Cu-phthalocyanine C.I. Pigment Blue 15:4) and 15.4 parts of Disperbyk® 167 dispersant (Byk Chemie) in 1-methoxy-2-propanol.

Reactive Binder-A is a solution of 10% by weight in Dowanol PM polyvinylalcohol Gohsefimer LL02 (commercially available from Nippon Gohsei) modified for 4 mol % with isocyanato ethyl methacrylate, based on the synthetic procedure described in EP 1,788,431 column [0142].

Sartomer 399 is dipentaerythritol pentaacrylate that was obtained from Sartomer Company, Inc. (Exton, Pa.).

Sipomer PAM100 is an ethylene glycol methacrylate phosphate with 4-5 ethylene glycol units that was obtained from Rhodia Inc. (Cranbury, N.J.).

TBMPS represents tribromomethyl phenyl sulphone.

THERMOTECT is a pre-bake gum that is commercially available from TECHNOVA (pH ~7.6).

TMSPMA is a 3-trimethoxysilylpropyl methacrylate.

Synthetic Preparation of Polymer A (Invention):

AIBN [2,2'-azobis(iso-butyronitrile), Vazo-64, 0.8 g], methyl methacrylate (10 g), acrylonitrile (10 g), N-vinyl carbazole (4 g, from Polymer Dajac), methacrylic acid (12 g), PEGMA (8 g), and DMAC (160 g) were placed in a 1000-ml 3-necked flask, equipped with magnetic stirring, temperature controller, and $N_2$ inlet. The reaction mixture was heated to 75° C. and stirred under $N_2$ protection overnight (about 16 hours). The % N.V. was measured with about 20%.

To above reaction mixture (after nitrogen protection was removed and temperature was reduced to 55° C.), potassium hydroxide (3.7 g) in water (20 g) was slowly added and a viscous liquid was formed. After stirring the mixture for 20 minutes, allyl bromide (8.0 g) was added and the mixture was stirred at 55° C. for 3 hours. Concentrated (36%) hydrochloric acid (7 g) in DMAC (25 g) was added to the flask and the reaction mixture was stirred for another 3 hours. The resulting reaction mixture was then slowly dropped into a mixture of 6 liters of ice water with 10 g of concentrated hydrochloric acid while stirring. The resulting precipitate was filtered and a fine white powder was obtained after filtration. The powder was dried at room temperature overnight and then at 50° C. for 3 hours to obtain 39 g of polymer solid.

Synthetic Preparation of Polymer B (Invention):

AIBN [2,2'-azobis(iso-butyronitrile), Vazo-64, 0.8 g], methyl methacrylate (5 g), acrylonitrile (15 g), N-vinyl carbazole (4 g, from Polymer Dajac), methacrylic acid (12 g), PEGMA (8 g), and DMAC (160 g) were placed in a 1000-ml 3-necked flask, equipped with magnetic stirring, temperature controller, and $N_2$ inlet. The reaction mixture was heated to 75° C. and stirred under $N_2$ protection overnight (about 16 hours). The % N.V. was measured with about 20%.

To above reaction mixture (after nitrogen protection was removed and temperature was reduced to 55° C.), potassium hydroxide (3.7 g) in water (20 g) was slowly added and a viscous liquid was formed. After stirring the mixture for 20 minutes, allyl bromide (8.0 g) was added and the mixture was stirred at 55° C. for 3 hours. Concentrated (36%) hydrochloric acid (7 g) in DMAC (25 g) was added to the flask and the reaction mixture was stirred for another 3 hours. The resulting reaction mixture was then slowly dropped into a mixture of 6 liters of ice water with 10 g of concentrated hydrochloric acid while stirring. The resulting precipitate was filtered and a fine white powder was obtained after filtration. The powder was dried at room temperature overnight and then at 50° C. for 3 hours to obtain 36 g of polymer solid.

Example 1

Preparation of Imagable Element Using Polymer A

An imagable layer formulation was prepared by dissolving Polymer A (1.90 g), DPHA (1.82 g), IR Dye 1 (0.26 g), Graft Polymer A (6.63 g), SR-399 (4.54 g, 40% in MEK), Pigment 951 (2.60 g, 10% in PGME), Sipomer PAM100 (0.17 g), Byk® 307 (0.87 g, 10% in PGME), TMSPMA (0.17 g), and Initiator A (0.61 g) in PGME (76.6 g), water (7.1 g) and MEK (46.8 g). An electrochemically-grained and sulfuric acid-anodized aluminum substrate that had been post-treated with poly(vinyl phosphonic acid) was coated with the imagable layer formulation at a dry coating weight of about 1.2 g/m$^2$ when properly dried at 210° F. (~99° C.) for about 2 minutes on a rotating drum.

The resulting imagable element was placed on a CREO Trendsetter 3244x image setter (Eastman Kodak Company, Burnaby, British Columbia, Canada) and exposed to an 830 nm IR laser at 4.5 W power and varying drum speed (250-60 RPM). The imaged element was then developed in a tray using various processing solutions listed in TABLE I below at 25° C. The imaging speed, which is determined by a minimum energy to achieve a stable solid density image and clean background, is also listed in TABLE I.

Another imagable element of this type was exposed at 150 mJ/cm$^2$, developed in THERMOTECT, and then mounted on a Miehle sheet-fed printing press using a wear ink containing 1.5% calcium carbonate to produce at least 20,000 good impressions.

Still another imagable element of this type was exposed at 120 mJ/cm$^2$ and subsequently heated (baked) at 130° C. for 60 seconds. The element was then developed using Gum 6 at 25° C. for 15 seconds. A good solid density image with a clean background was obtained.

Example 2

Preparation of Imagable Element Using Polymer B

An imagable layer formulation was prepared by dissolving Polymer B (1.27 g), DPHA (1.21 g), IR Dye 1 (0.17 g), Graft Polymer A (4.42 g), SR-399 (3.03 g, 40% in MEK), Pigment 951 (1.73 g, 10% in PGME), PAM100 (0.12 g), Byk® 307 (0.58 g, 10% in PGME), TMSPMA (0.12 g), and Initiator A (0.40 g) in PGME (51.1 g), water (4.7 g) and MEK (31.2 g). An electrochemically-grained and sulfuric acid-anodized aluminum substrate that had been post-treated with poly(vinyl phosphonic acid) was coated with the formulation at a dry coating weight of about 1.2 g/m$^2$ when properly dried at 210° F. (~99° C.) for about 2 minutes on a rotating drum.

The resulting imagable element was placed on a CREO Trendsetter 3244x image setter (Eastman Kodak Company, Burnaby, British Columbia, Canada) and exposed to an 830 nm IR laser at 4.5 W power and varying drum speed (250-60 RPM). The imaged element was then developed in a tray using various processing solutions listed in TABLE I below at 25° C. The imaging speed, which is determined by a minimum energy to achieve a stable solid density image with clean background, is also listed in TABLE I. The clean-out rating was determined by density reading on background area after processing (Good=0.31-0.34, Poor >0.34) based on a density of 0.32 for raw substrate.

TABLE I

Development Test

| Element | Processing solution | Imaging speed (mJ/cm$^2$) | Clean-out rating |
| --- | --- | --- | --- |
| Example 1 | THERMOTECT | 50 | Good |
| | Gum 1 | 70 | Good |
| | Gum 2 | 70 | Good |
| | Gum 3 | 80 | Good |
| | Gum 4 | 90 | Good |
| | Gum 5 | 80 | Good |
| | Gum 6 | 90 | Good |
| | MX1591 | n/a | Poor |
| | Gum 7 | n/a | Poor |
| | Water | n/a | Poor |
| | Gum 8 | 80 | Good |
| Example 2 | THERMOTECT | 50 | Good |
| | Gum 1 | 80 | Good |
| | Gum 2 | 70 | Good |
| | Gum 3 | 80 | Good |
| | Gum 4 | 90 | Good |
| | Gum 5 | 80 | Good |
| | Gum 6 | 80 | Good |
| | MX1591 | n/a | Poor |
| | Gum 7 | n/a | Poor |
| | Water | n/a | Poor | n/a = not available

The results in TABLE I show that successful development of the imaged elements described herein can be accomplished with a gum (or gum solution) that has a pH of from about 7 to about 11 and contains at least one anionic surfactant in an amount of at least 1 weight %. As noted in the results in TABLE I, MX 1591 contains an anionic surfactant but has too low a pH (4.2) and performed poorly, as did mere water. In addition, Gum 7 also contained an anionic surfactant but its pH was only 7 and thus, it performed poorly.

Gum 8 contained a mixture of anionic surfactants according to the present invention and provided a "good" Clean-out rating.

Comparative Example 1

This example illustrates that the printing plate precursor identified as PPP-4 in EP 1,788,431 (Agfa, column [0144]) exhibited no image when imaged at up to 180 ml/cm$^2$ when the overcoat layer was omitted.

An imagable layer formulation was prepared by dissolving Reactive Binder-A (7.58 g, 10% in PGME), IR Dye 2 (0.09 g), TBMPS (0.11 g), Monomer A (0.97 g), D11 dye (0.02 g), and Byk® 307 (0.19 g, 10% in PGME) in 37.33 g of PGME. An electrochemically-grained and sulfuric acid-anodized aluminum substrate that had been post-treated with poly(vinyl phosphonic acid) was coated with above imagable layer formulation at a dry coating weight of about 0.75 g/m$^2$. The resulting imagable element was placed on a CREO Trendsetter 3244x image setter and exposed to an 830 nm IR laser at 5.5 W power and varying drum speed (250-50 RPM). The imaged element was then developed in a tray using THERMOTECT developer at 25° C. No image was obtained from the exposed areas.

Samples of the same imagable element having the imagable layer were overcoated with a 5% poly(vinyl alcohol) (degree of hydrolysis 88%) solution in a water/isopropanol mixture to provide overcoat layers with a dry coating weight of 1.9 g/m$^2$. The resulting 2-layer imagable elements were also placed on a CREO Trendsetter 3244x image setter and exposed to an 830 nm IR laser at 5.5 W power and varying drum speed (250-50 RPM). The imaged elements were then developed in a tray using THERMOTECT developer at 25° C. Only weak images were obtained from the IR laser imaging and development.

The invention has been described in detail with particular reference to certain preferred embodiments thereof, but it will be understood that variations and modifications can be effected within the spirit and scope of the invention.

The invention claimed is:
1. A method of providing an imaged and developed lithographic printing plate comprising:
A) using a laser providing infrared radiation having a $\lambda_{max}$ of from about 750 to about 1200 nm, imagewise expos- ing a negative-working imagable lithographic printing place comprising an aluminum-containing hydrophilic substrate having directly thereon an outermost negative-working imagable layer to provide exposed and non-exposed regions, said outermost negative-working imagable layer comprising:

a free radically polymerizable component that is an ethylenically unsaturated free-radical polymerizable monomer, oligomer, or crosslinkable polymer, an initiator composition capable of generating free radicals sufficient to initiate polymerization of free radically polymerizable groups upon exposure to imaging radiation, said initiator composition comprising a diaryliodonium borate that is represented by the following Structure (IB):

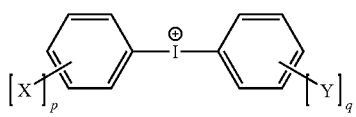

(IB)

wherein X and Y are independently halo, alkyl, alkoxy, aryl, or cycloalkyl groups, or two or more adjacent X or Y groups can be combined to form a fused carbocyclic or heterocyclic ring with the respective phenyl groups, p and q are independently 0 or integers of 1 to 5 as long as either p or q is at least 1 and the sum of the carbon atoms in the X and Y substituents or fused ring(s) is at least 6, and $Z^\ominus$ is an organic anion represented by the following Structure ($IB_Z$):

($IB_z$)

wherein $R_1$, $R_2$, $R_3$ and $R_4$ are independently alkyl, aryl, alkenyl, alkynyl, cycloalkyl, or heterocyclyl groups, or two or more of $R_1$, $R_2$, $R_3$ and $R_4$ can be joined together to form a heterocyclic ring with the boron atom, an infrared radiation absorbing compound that is an infrared radiation sensitive dye having a tetraaryl pentadiene chromophore, and a primary polymeric binder that is represented by the following Structure (IA):

$$-(A)_w-(B)_x-(C)_y-(D)_z-$$ (IA)

wherein said A recurring units are derived from at least an allyl (meth)acrylate or styryl (meth)acrylate, said B recurring units are derived from one or more of (meth)acrylonitrile, said C recurring units are derived from one or more of (meth)acrylic acid, 4-carboxyphenyl (meth)acrylate, and 4-carboxystyrene, said D recurring units are derived from one or more of vinyl carbazole, methyl (meth)acrylate, poly(ethylene glycol) methyl ether (meth)acrylate, and a styrene monomer, w is from about 5 to about 50 mol %, x is from about 30 to about 70 mol %, y is from about 5 to about 20 mol %, and z is from 10 to about 40 mol %, B) with or without a post-exposure baking step, developing said imagewise exposed lithographic printing plate with a gum, off-press to remove only said non-exposed regions to provide an imaged and developed lithographic printing plate, said gum having a pH greater than 7 and up to about 11 and comprising at least 1 weight % of one or more anionic surfactants.

2. The method of claim 1 wherein at least 3 of $R_1$, $R_2$, $R_3$, and $R_4$ are the same or different substituted or unsubstituted aryl groups.

3. The method of claim 1 wherein said gum has a pH of from about 7.5 to about 10.

4. The method of claim 1 wherein at least one of said one or more anionic surfactants has a sulfonic acid group or salt thereof and is present in said gum in an amount of from about 1 to about 45 weight %.

5. The method of claim 4 wherein at least one of said one or more anionic surfactants is an alkyldiphenyloxide disulfonate that is present in said gum in an amount of from about 3 to about 30 weight %.

6. The method of claim 1 wherein said A recurring units are derived from at least allyl (meth)acrylate, said B recurring units are derived from one or more of (meth)acrylonitrile, said C recurring units are derived from one or more of (meth) acrylic acid, 4-carboxyphenyl (meth)acrylate, and 4-carboxystyrene.

7. The method of claim 1 wherein said gum comprises two or more anionic surfactants at least one of which is an alkyldiphenyloxide disulfonate.

8. The method of claim 7 wherein said gum comprises two or more different anionic surfactants one of which is an alkali alkyl naphthalene sulfonate that is present in an amount of from about 1 to about 30 weight %.

9. The method of claim 1 wherein development using the gum is carried out without a post-exposure baking step.

* * * * *